US010885958B2

(12) United States Patent
Lim et al.

(10) Patent No.: US 10,885,958 B2
(45) Date of Patent: Jan. 5, 2021

(54) SEMICONDUCTOR DEVICE WITH PHASE DIFFERENCE DETECTION CIRCUIT BETWEEN A CLOCK AND STROBE SIGNAL

(71) Applicant: SK hynix Inc., Icheon-si (KR)

(72) Inventors: Yu Ri Lim, Daejeon (KR); Sangsic Yoon, Icheon-si (KR)

(73) Assignee: SK hynix Inc., Gyeonggi (KR)

( * ) Notice: Subject to any disclaimer, the term of this patent is extended or adjusted under 35 U.S.C. 154(b) by 0 days.

(21) Appl. No.: 16/192,479

(22) Filed: Nov. 15, 2018

(65) Prior Publication Data
US 2019/0318773 A1 Oct. 17, 2019

(30) Foreign Application Priority Data
Apr. 17, 2018 (KR) .................. 10-2018-0044686

(51) Int. Cl.
*G11C 7/22* (2006.01)
*G11C 7/10* (2006.01)

(52) U.S. Cl.
CPC .............. *G11C 7/222* (2013.01); *G11C 7/106* (2013.01); *G11C 7/1066* (2013.01); *G11C 7/1093* (2013.01)

(58) Field of Classification Search
CPC ....... G11C 7/222; G11C 7/106; G11C 7/1093; G11C 7/1066
See application file for complete search history.

(56) References Cited

U.S. PATENT DOCUMENTS

| 6,167,495 A * | 12/2000 | Keeth ................. G11C 7/1072 711/105 |
| 8,121,237 B2 * | 2/2012 | Stott ..................... G11C 7/1051 365/193 |
| 8,671,303 B2 | 3/2014 | Chong et al. |
| 2003/0112909 A1 * | 6/2003 | Best ......................... G06F 1/10 375/355 |
| 2005/0081129 A1 * | 4/2005 | Shah ...................... H04L 7/048 714/701 |
| 2007/0211555 A1 * | 9/2007 | Lee .......................... G11C 8/06 365/230.08 |
| 2010/0124131 A1 * | 5/2010 | Onishi ................. G11C 7/1066 365/193 |
| 2012/0155205 A1 * | 6/2012 | Ku ........................ G11C 7/1084 365/222 |
| 2015/0256183 A1 * | 9/2015 | Park ....................... G11C 7/222 327/115 |
| 2018/0075884 A1 * | 3/2018 | Choi ..................... G06F 3/0659 |

FOREIGN PATENT DOCUMENTS

KR 1020110024200 A 3/2011

* cited by examiner

*Primary Examiner* — Sultana Begum

(57) ABSTRACT

A semiconductor device includes a phase difference detection circuit configured to generate a detection signal by detecting a phase difference of a clock and a strobe signal, the detection signal being generated at a logic level of the strobe signal in synchronization with the clock, and configured to generate a write clock by delaying the strobe signal. The semiconductor device also includes a control signal generation circuit configured to store the detection signal, in synchronization with the write clock, and configured to output the stored detection signal as a control signal.

14 Claims, 7 Drawing Sheets

SEMICONDUCTOR DEVICE WITH PHASE DIFFERENCE DETECTION CIRCUIT BETWEEN A CLOCK AND STROBE SIGNAL

CROSS-REFERENCE TO RELATED APPLICATION

The present application claims priority under 35 U.S.C. § 119(a) to Korean Patent Application No. 10-2018-0044686 filed on Apr. 17, 2018, in the Korean Intellectual Property Office, which is incorporated herein by reference in its entirety.

BACKGROUND

1. Technical Field

Embodiments of the present disclosure relate to a semiconductor device which inputs and outputs data by adjusting the phase difference between a clock and a strobe signal.

2. Related Art

A domain crossing margin (tDQSS) between a strobe signal (DQS) and a clock (CLK) prescribes the performance of a 1$ semiconductor device. The semiconductor device performs a write leveling operation for calibrating the skew between the strobe signal (DQS) and the clock (CLK), in a write operation.

In general, when the write leveling operation is entered, the semiconductor device compares the phases of the strobe signal (DQS) and the clock (CLK) and feeds back a comparison result to an external controller. The external controller adjusts the phase of the strobe signal (DQS) based on the comparison result fed back from the semiconductor device.

SUMMARY

In accordance with the present teachings, a semiconductor device may include a phase difference detection circuit configured to generate a detection signal by detecting a phase difference of a clock and a strobe signal, the detection signal being generated at a logic level of the strobe signal in synchronization with the clock, and configured to generate a write clock by delaying the strobe signal. The semiconductor device may also include a control signal generation circuit configured to store the detection signal, in synchronization with the write clock, and configured to output the stored detection signal as a control signal.

Also in accordance with the present teachings, a semiconductor device may include a write leveling control circuit configured to generate a detection signal, and configured to output the detection signal, which is stored during a toggling period of the strobe signal, as a control signal, wherein the clock and the strobe signal are inputted to the write leveling control circuit from an external device to the write leveling control circuit, and wherein the detection signal is generated at a logic level of the strobe signal in synchronization with the clock. The semiconductor device may also include a phase difference adjustment circuit configured to generate an internal strobe signal, in response to the control signal, by adjusting a phase difference of the clock and a write clock, wherein the write clock is generated from the strobe signal. The semiconductor device may further include an internal circuit configured to at least one of input and output data in synchronization with the internal strobe signal.

DETAILED DESCRIPTION

A semiconductor device is described below with reference to the accompanying drawings and in accordance with various embodiments of the present disclosure.

Some embodiments are directed to a semiconductor device which detects the phase difference of a clock and a strobe signal having different frequencies, holds a detection result generated during the toggling period of the strobe signal, after the toggling period, and adjusts the phase difference of the clock and the strobe signal depending on the detection result.

In accordance with several embodiments, by detecting the phase difference of a clock and a strobe signal having different frequencies, holding a detection result generated during the toggling period of the strobe signal, after the toggling period, and adjusting the phase difference of the clock and the strobe signal depending on the detection result, it is possible to secure the reliability of a write leveling operation.

Figure 1:
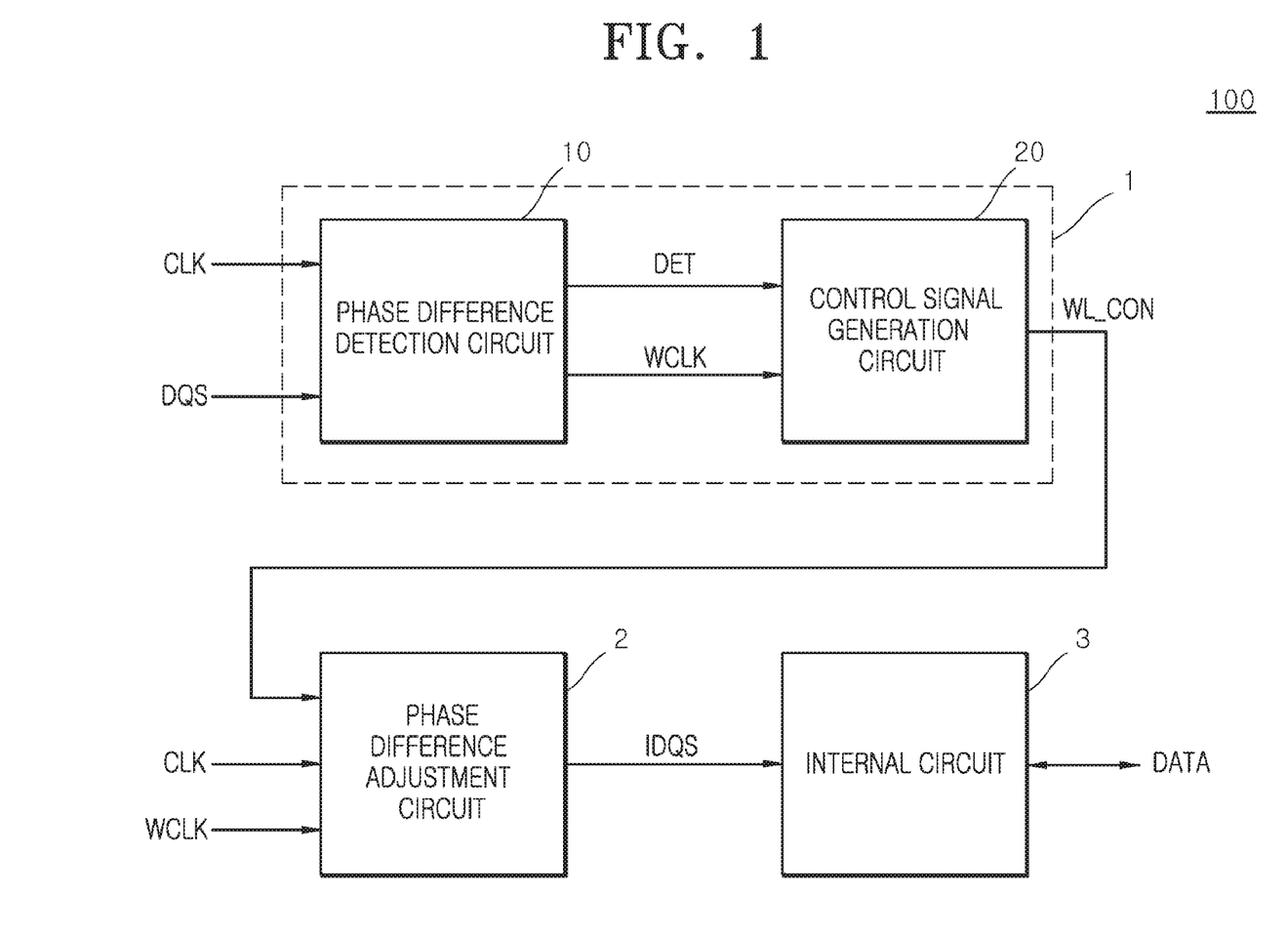
FIG. 1 shows a block diagram illustrating a configuration of a semiconductor device in accordance with an embodiment.

As shown in FIG. 1, a semiconductor device 100 in accordance with an embodiment may include a write leveling control circuit 1, a phase difference adjustment circuit 2, and an internal circuit 3. The write leveling control circuit 1 may include a phase difference detection circuit 10 and a control signal generation circuit 20.

The phase difference detection circuit 10 may detect the phase difference of a clock CLK and a strobe signal DQS and generate a detection signal DET. According to one embodiment, the phase difference detection circuit 10 may generate the detection signal DET which has the logic level of the strobe signal DQS at the rising edge time of the clock CLK. According to another embodiment, the phase difference detection circuit 10 may generate the detection signal DET which has the logic level of the clock CLK at the rising edge time of the strobe signal DQS. In accordance with the teachings herein, generating a third signal having the logic level of a second signal at the rising edge time of a first signal is equivalent to generating the third signal having the logic level of the second signal at the falling edge time of the first signal when the first signal has been inverted. Similarly, storing the third signal in synchronization with the rising edge time of a fourth signal is equivalent to storing the third signal in synchronization with the falling edge time of the fourth signal when the fourth signal has been inverted. The phase difference detection circuit 10 may delay the strobe signal DQS and generate a write clock WCLK. The clock CLK and the strobe signal DQS may be set as signals which have different frequencies. For example, the frequency of the strobe signal DQS may be set to 2N times the frequency of the clock CLK, where N is a positive integer. The clock CLK may be set as a signal which cyclically toggles. The strobe signal DQS may be set as a signal which toggles only during a preset period. For example, a preset period during which the strobe signal DQS toggles may be set as a period during which data DATA is at least one of inputted and outputted. In some instances, the strobe signal is toggled during multiple or different preset periods. The clock CLK and the strobe signal DQS may be inputted to the phase difference detection circuit 10 from an external device, such as a controller, which controls the semiconductor device 100, or test equipment. The detection signal DET may be set as a signal which is enabled in the case where the phase of the strobe signal DQS is earlier than the phase of the clock CLK.

The word "preset" as used herein with respect to a parameter, such as a preset period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The control signal generation circuit 20 may store the detection signal DET in synchronization with the write clock WCLK. The control signal generation circuit 20 may store the detection signal DET at the rising edge time of the write clock WCLK. The control signal generation circuit 20 may output the stored detection signal DET as a control signal WL_CON. The control signal generation circuit 20 may output the detection signal DET, stored during the toggling period of the write clock WCLK, as the control signal WL_CON. The control signal generation circuit 20 may hold the logic level of the control signal WL_CON after the toggling period of the write clock WCLK.

The write leveling control circuit 1 configured as indicated above may detect the phase difference of the clock CLK and the strobe signal DQS received from an external device and generate the detection signal DET. The detection signal DET may be generated to have the logic level of the strobe signal DQS at the rising edge time of the clock CLK. The write leveling control circuit 1 may output the detection signal DET, stored during the toggling period of the strobe signal DQS, as the control signal WL_CON.

The phase difference adjustment circuit 2 may adjust the phase difference of the clock CLK and the write clock WCLK generated from the strobe signal DQS, in response to the control signal WL_CON. The phase difference adjustment circuit 2 may delay a time at which the write clock WCLK toggles, in the case where the control signal WL_CON is enabled. The phase difference adjustment circuit 2 may adjust the phase difference of the clock CLK and the write clock WCLK by adjusting the time at which the write clock WCLK toggles. The phase difference adjustment circuit 2 may output the write clock WCLK, the phase of which is adjusted, as an internal strobe signal IDQS. The phase difference adjustment circuit 2 may perform a write leveling operation of adjusting the phase difference of the clock CLK and the write clock WCLK generated from the strobe signal DQS.

The internal circuit 3 may input/output data DATA in synchronization with the internal strobe signal IDQS. The internal circuit 3 may store data DATA, inputted from an external device, in synchronization with the internal strobe signal IDQS. The internal circuit 3 may output stored data DATA to an external device in synchronization with the internal strobe signal IDQS. The internal circuit 3 may be embodied by a general memory circuit which stores data DATA and outputs stored data DATA.

Figure 2:
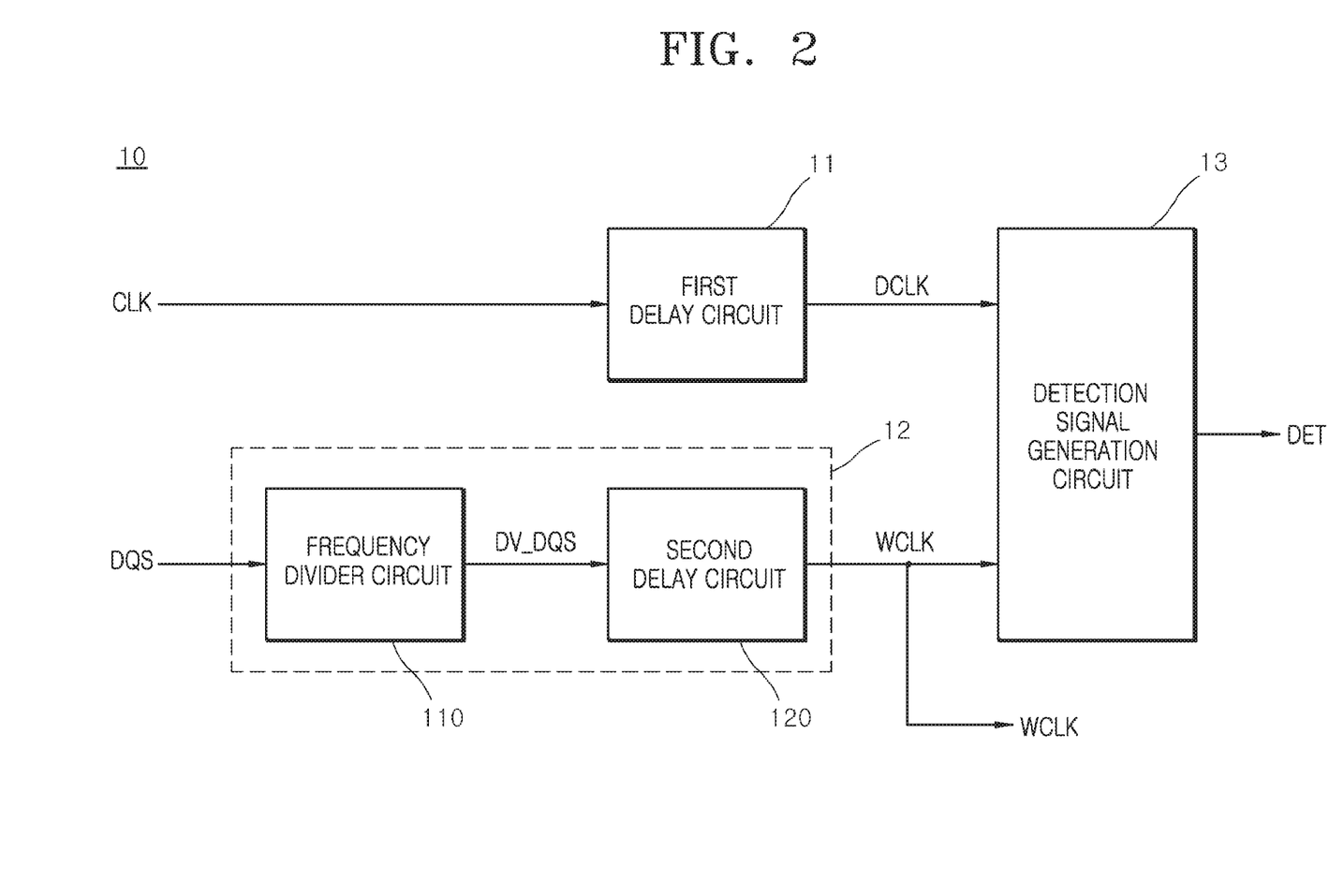
FIG. 2 shows a block diagram illustrating a configuration of the phase difference detection circuit included in the semiconductor device shown in FIG. 1.

Referring to FIG. 2, the phase difference detection circuit 10 of FIG. 1 is shown in accordance with an embodiment of the present teachings. The phase difference detection circuit 10 may include a first delay circuit 11, a write clock generation circuit 12, and a detection signal generation circuit 13.

The first delay circuit 11 may delay the clock CLK and generate a delayed clock DCLK. The first delay circuit 11 may delay the clock CLK by a delay amount to generate the delayed clock DCLK.

The write clock generation circuit 12 may include a frequency divider circuit 110 and a second delay circuit 120.

The frequency divider circuit 110 may divide the frequency of the strobe signal DQS and generate a divided strobe signal DV_DQS. The frequency divider circuit 110 may generate the divided strobe signal DV_DQS to have a frequency of ½N times the frequency of the strobe signal DQS, where "N" represents a positive integer. The frequency difference of the strobe signal DQS and the divided strobe signal DV_DQS may be different for different embodiments.

The second delay circuit 120 may delay the divided strobe signal DV_DQS and generate the write clock WCLK. The second delay circuit 120 may delay the divided strobe signal DV_DQS by a delay amount to generate the write clock WCLK. For an embodiment, the delay amount of the second delay circuit 120 may be set equal to the delay amount of the first delay circuit 11. For other embodiments, a first delay introduced by the first delay circuit is substantially the same as a second delay introduced by the second delay circuit. The second delay circuit 120, for example, may have the same configuration or be a replica of the first delay circuit 11.

The write clock generation circuit 12 configured as indicated above may divide the frequency of the strobe signal DQS, delay the frequency-divided strobe signal DQS, and generate the write clock WCLK.

The detection signal generation circuit 13 may generate the detection signal DET from the write clock WCLK in synchronization with the delayed clock DCLK. The detection signal generation circuit 13 may generate the detection signal DET to have the logic level of the write clock WCLK, in synchronization with the delayed clock DCLK. For example, the detection signal generation circuit 13 may generate the detection signal DET to have the logic level of the write clock WCLK at the rising edge time of the delayed clock DCLK.

Figure 3:
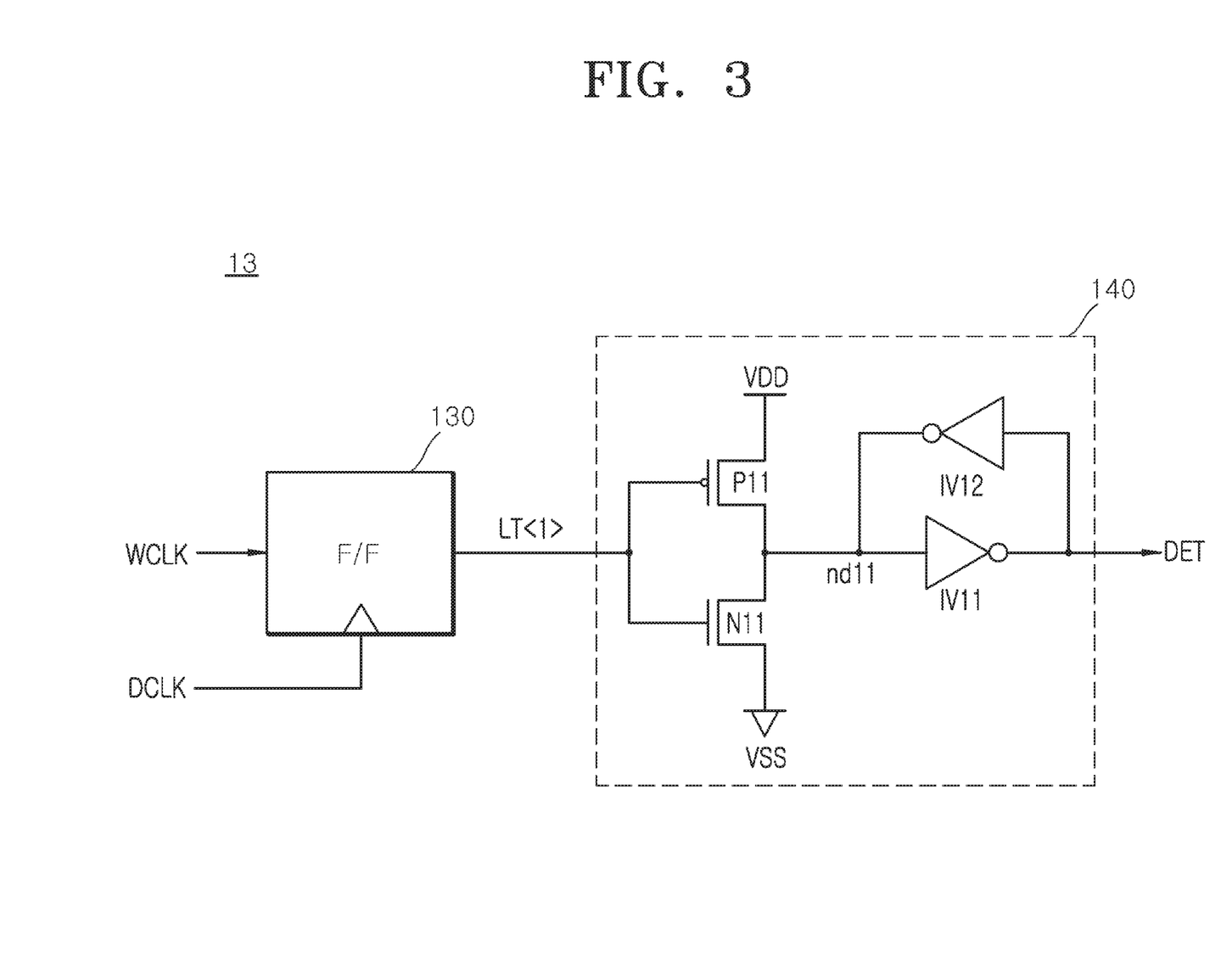
FIG. 3 shows a circuit diagram illustrating a configuration of the detection signal generation circuit included in the phase difference detection circuit shown in FIG. 2.

Referring to FIG. 3, the detection signal generation circuit 13 of FIG. 2 is shown in accordance with an embodiment of the present teachings. The detection signal generation circuit 13 may include a first latch signal generation circuit 130 and a first buffer circuit 140.

The first latch signal generation circuit 130 may output the write clock WCLK as a first latch signal LT<1>, in synchronization with the delayed clock DCLK. The first latch signal generation circuit 130 may store the write clock WCLK at the rising edge time of the delayed clock DCLK. The first latch signal generation circuit 130 may output the stored write clock WCLK as the first latch signal LT<1>. The first latch signal generation circuit 130, for example, may be embodied by a general flip-flop.

The first buffer circuit 140 may be embodied by a P-type metal-oxide-semiconductor (PMOS) transistor P11, an N-type metal-oxide-semiconductor (NMOS) transistor N11, and inverters IV11 and IV12. The first buffer circuit 140 may buffer the first latch signal LT<1> and generate the detection signal DET.

The operation of generating the detection signal DET in the first buffer circuit 140 is described below in detail for an embodiment consistent with the present teachings.

The first buffer circuit 140 may pull-up drive a node nd11 to a logic high level as the PMOS transistor P11 is turned on in the case where the first latch signal LT<1> has a logic low level. The logic low level, for example, corresponds to a voltage VSS, which is less than a voltage VDD. The first buffer circuit 140 may invert the signal of the node nd11 in the case where the first latch signal LT<1> has the logic low level to generate the detection signal DET having a logic low level. The inverters IV11 and IV12 of the first buffer circuit 140 may be embodied by latches, having input terminals and output terminals coupled to each other, and may store the detection signal DET.

The first buffer circuit 140 may pull-down drive the node nd11 to a logic low level as the NMOS transistor N11 is turned on in the case where the first latch signal LT<1> has a logic high level. The logic high level, for example, corresponds to the voltage VDD, which is greater than the voltage VSS. The first buffer circuit 140 may invert the signal of the node nd11 in the case where the first latch signal LT<1> has the logic high level to generate the detection signal DET having a logic high level. The inverters IV11 and IV12 of the first buffer circuit 140 may be embodied by latches, having input terminals and output terminals coupled to each other, and may store the detection signal DET.

Figure 4:
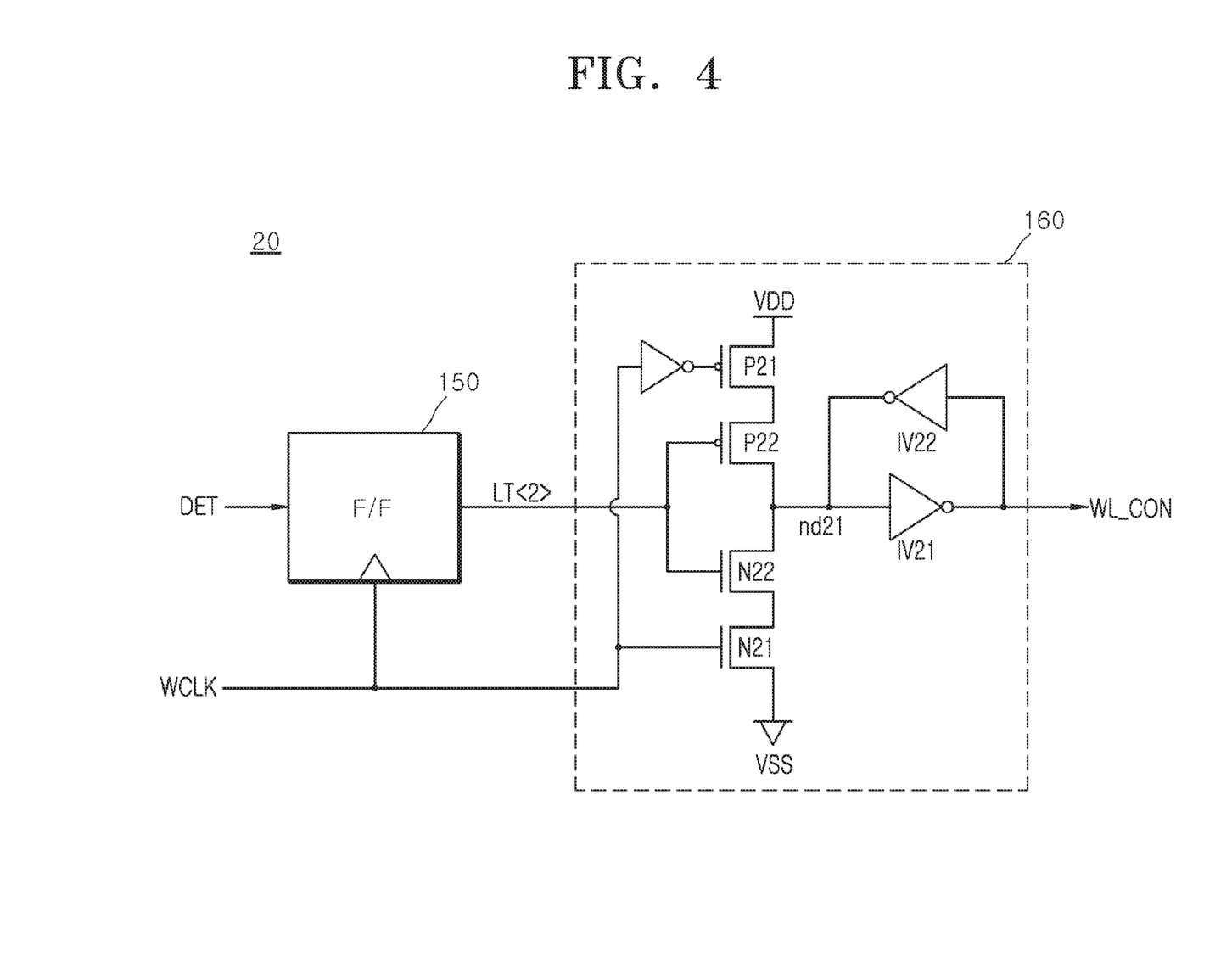
FIG. 4 shows a circuit diagram illustrating a representation of an example of the configuration of the control signal generation circuit included in the semiconductor device shown in FIG. 1.

Referring to FIG. 4, the control signal generation circuit 20 of FIG. 1 is shown in accordance with an embodiment of the present teachings. The control signal generation circuit 20 may include a second latch signal generation circuit 150 and a second buffer circuit 160.

The second latch signal generation circuit 150 may output the detection signal DET as a second latch signal LT<2>, in synchronization with the write clock WCLK. The second latch signal generation circuit 150 may store the detection signal DET at the rising edge time of the write clock WCLK. The second latch signal generation circuit 150 may output the stored detection signal DET as the second latch signal LT<2>. The second latch signal generation circuit 150 may be embodied by a general flip-flop.

The second buffer circuit 160 may include PMOS transistors P21 and P22, NMOS transistors N21 and N22, and inverters IV21 and IV22. The second buffer circuit 160 may buffer the second latch signal LT<2>, in response to the pulse of the write clock WCLK, and generate the control signal WL_CON. The second buffer circuit 160 may hold the logic level of the control signal WL_CON in the case where the pulse of the write clock WCLK is not inputted.

The operation of generating the control signal WL_CON in the second buffer circuit 160 is described in detail below in accordance with an embodiment of the present teachings.

In the second buffer circuit 160, the PMOS transistor P21 and the NMOS transistor N21 are turned on in the case where the pulse of the write clock WCLK is at a logic high level. In the second buffer circuit 160, in the case where the pulse of the write clock WCLK is at the logic high level and the second latch signal LT<2> is at a logic low level, the PMOS transistor P22 may be turned on and pull-up drive a node nd21 to a logic high level, for example, corresponding to the voltage VDD. In the second buffer circuit 160, in the case where the pulse of the write clock WCLK is at the logic high level and the second latch signal LT<2> is at the logic low level, the signal of the node nd21 may be inverted and the control signal WL_CON of a logic low level may be generated. The inverters IV21 and IV22 of the second buffer circuit 160 may be embodied by latches for which input terminals and output terminals are coupled with each other, and which store the control signal WL_CON. For the embodiment shown, the second buffer circuit 160 does not drive the node nd21, regardless of the logic level of the second latch signal LT<2>, in the case where the pulse of the write clock WCLK is not inputted. The inverters IV21 and IV22 of the second buffer circuit 160 may hold the logic level of the control signal WL_CON in the case where the logic level of the node nd21 is not changed.

In the second buffer circuit 160, in the case where the pulse of the write clock WCLK is at the logic high level, the PMOS transistor P21 and the NMOS transistor N21 are turned on. In the second buffer circuit 160, in the case where the pulse of the write clock WCLK is at the logic high level and the second latch signal LT<2> is at a logic high level, the NMOS transistor N22 may be turned on and pull-down drive the node nd21 to a logic low level, for example, corresponding to the voltage VSS, which is less than the voltage VDD. In the second buffer circuit 160, in the case where the pulse of the write clock WCLK is at the logic high level and the second latch signal LT<2> is at the logic high level, the signal of the node nd21 may be inverted and the control signal WL_CON of a logic high level may be generated. The inverters IV21 and IV22 of the second buffer circuit 160 may be embodied by latches for which input terminals and output terminals are coupled with each other, and may store the control signal WL_CON. The second buffer circuit 160 may hold the logic level of the control signal WL_CON in the case where the pulse of the write clock WCLK is not inputted. For the embodiment shown, the second buffer circuit 160 does not drive the node nd21, regardless of the logic level of the second latch signal LT<2>, in the case where the pulse of the write clock WCLK is not inputted. The inverters IV21 and IV22 of the second buffer circuit 160 may hold the logic level of the control signal WL_CON in the case where the logic level of the node nd21 is not changed.

Figure 5:
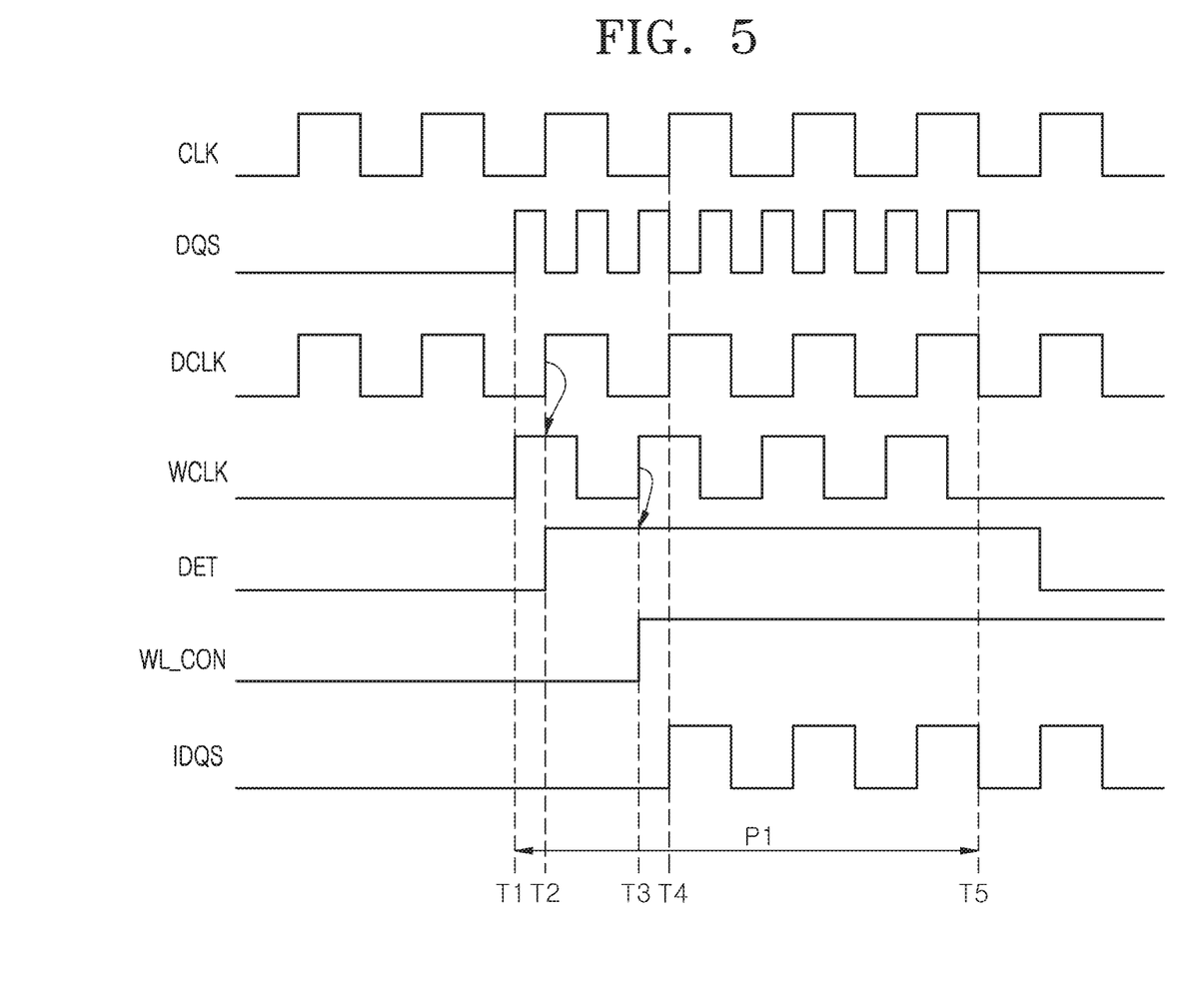
FIGS. 5 and 6 show timing diagrams to assist in the explanation of operations of the semiconductor device in accordance with an embodiment.

With reference to FIG. 5, the operation of the semiconductor device 100 is described in accordance with an embodiment of the present teachings. The phase difference of the clock CLK and the strobe signal DQS is detected, and the phase of the strobe signal DQS is adjusted depending on the detection result. For the following described case, the phase of the strobe signal DQS is earlier than the phase of the clock CLK, as shown.

The clock CLK and the strobe signal DQS, which have different frequencies, are inputted from an external device or source. As shown, the frequency of the strobe signal DQS is set to two times the frequency of the clock CLK. The clock CLK is inputted as a signal which cyclically toggles. The strobe signal DQS is inputted as a signal which toggles only during a preset period P1. The preset period P1 during which the strobe signal DQS toggles may be set differently for different embodiments. For example, the period P1 may be set as a period during which data DATA is inputted and/or outputted. The preset period P1 shown in FIG. 5 is set from a time T1 to a time T5.

The first delay circuit 11 of the phase difference detection circuit 10 delays the clock CLK and generates the delayed clock DCLK. For convenience of explanation, it is assumed that there is no delay introduced by the first delay circuit 11 for the described case, so the delayed clock DCLK appears the same as the clock CLK.

At the time T1, the frequency divider circuit 110 of the write clock generation circuit 12 divides the frequency of the strobe signal DQS and generates the divided strobe signal DV_DQS shown in FIG. 2.

The second delay circuit 120 of the write clock generation circuit 12 delays the divided strobe signal DV_DQS and generates the write clock WCLK. For convenience of explanation, it is assumed that there is no delay introduced by the second delay circuit 120 for the described case. Without the delay, the write clock WCLK and the divided strobe signal DV_DQS appear the same.

At the time T2, the first latch signal generation circuit 130 of the detection signal generation circuit 13 latches the write clock WCLK of the logic high level at the rising edge time of the delayed clock DCLK (as indicated by the leftmost descending arrow of FIG. 5) and generates the first latch signal LT<1> (shown in FIG. 3) of the logic high level.

The first buffer circuit 140 of the detection signal generation circuit 13 buffers the first latch signal LT<1> of the logic high level and generates the detection signal DET of the logic high level.

At the time T3, the second latch signal generation circuit 150 of the control signal generation circuit 20 latches the detection signal DET of the logic high level at the rising edge time of the write clock WCLK (as indicated by the rightmost descending arrow of FIG. 5) and generates the second latch signal LT<2> (shown in FIG. 4) of the logic high level.

The second buffer circuit 160 of the control signal generation circuit 20 buffers the second latch signal LT<2>, in response to the pulse of the write clock WCLK of the logic high level, and generates the control signal WL_CON of the logic high level. In the case where the pulse of the write clock WCLK is not inputted, the second buffer circuit 160 does not drive the node nd21, regardless of the logic level of the second latch signal LT<2>, and holds the logic level of the control signal WL_CON.

The phase difference adjustment circuit 2 slowly adjusts the phase of the write clock WCLK, in response to the control signal WL_CON of the logic high level, and generates the internal strobe signal IDQS, which toggles from a time T4. The phase difference adjustment circuit 2 performs a write leveling operation of slowly adjusting the phase of the write clock WCLK by the control signal WL_CON of the logic high level. It is shown that the rising edge of the internal strobe signal IDQS and the rising edge of the clock CLK are synchronized at the time T4 by the write leveling operation.

The internal circuit 3 (shown in FIG. 1) inputs and/or outputs data DATA in synchronization with the internal strobe signal IDQS.

Figure 6:
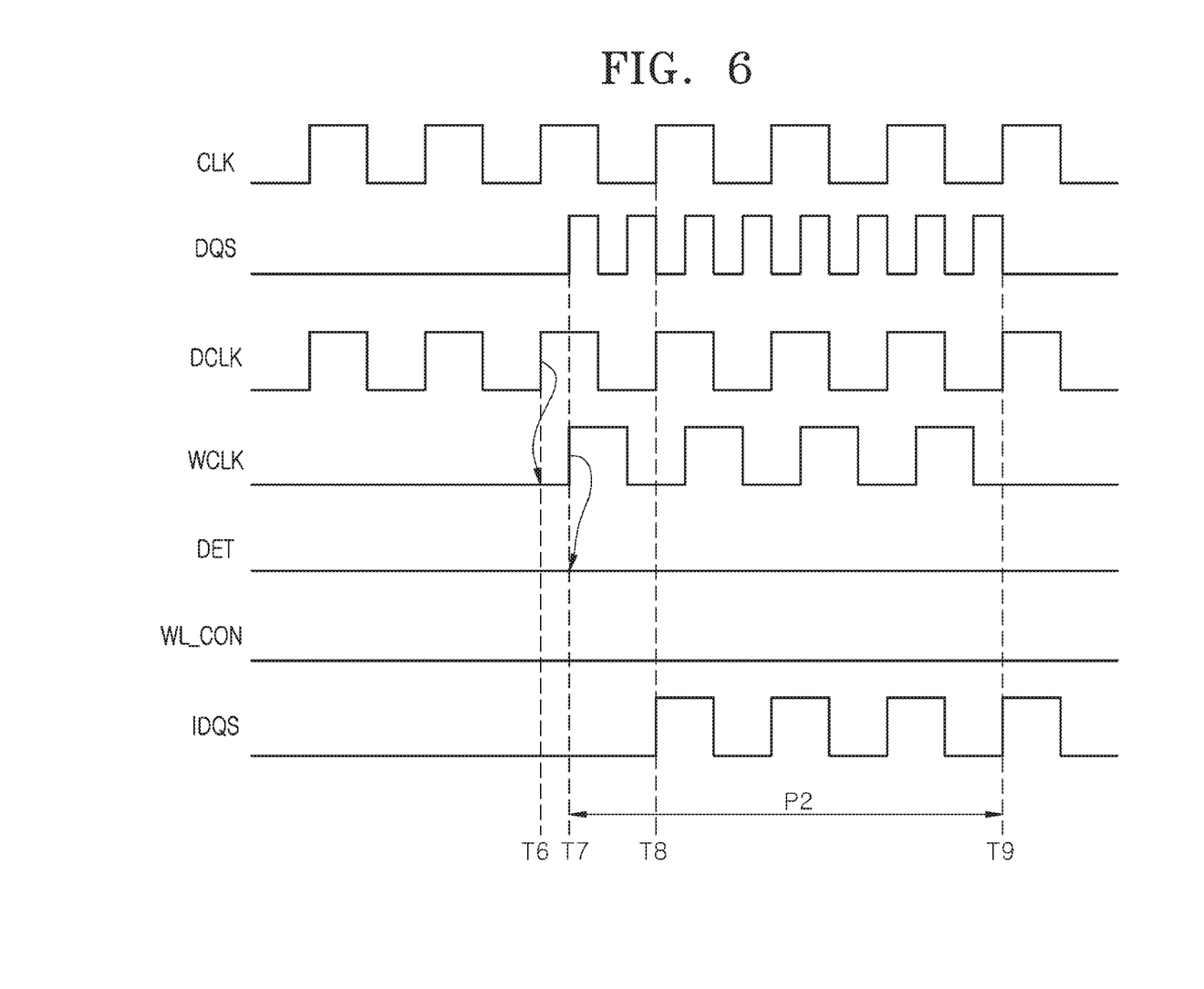

With reference to FIG. 6, the operation of the semiconductor device 100 is described in accordance with the embodiment of the present teachings. The phase difference of the clock CLK and the strobe signal DQS is detected, and the phase of the strobe signal DQS is adjusted depending on the detection result. For the following described case, the phase of the strobe signal DQS is later than the phase of the clock CLK, as shown.

The clock CLK and the strobe signal DQS, which have different frequencies, are inputted from an external device or source. As shown, the frequency of the strobe signal DQS is set to two times the frequency of the clock CLK. The clock CLK is inputted as a signal which cyclically toggles. The strobe signal DQS is inputted as a signal which toggles only during a preset period P2. The preset period P2 during which the strobe signal DQS toggles may be set differently for different embodiments. For example, the period P2 may be set as a period during which data DATA is inputted and/or outputted. The preset period P2 shown in FIG. 6 is set from a time T7 to a time T9.

The first delay circuit 11 of the phase difference detection circuit 10 delays the clock CLK and generates the delayed clock DCLK. For convenience of explanation, it is assumed that there is no delay introduced by the first delay circuit 11 for the described case, so the delayed clock DCLK appears the same as the clock CLK.

At a time T6, the first latch signal generation circuit 130 of the detection signal generation circuit 13 latches the write clock WCLK of a logic low level at the rising edge time of the delayed clock DCLK (as indicated by the leftmost descending arrow of FIG. 6) and generates the first latch signal LT<1> (shown in FIG. 3) of the logic low level.

The first buffer circuit 140 of the detection signal generation circuit 13 buffers the first latch signal LT<1> of the logic low level and generates the detection signal DET of the logic low level.

At the time T7, the frequency divider circuit 110 of the write clock generation circuit 12 divides the frequency of the strobe signal DQS and generates the divided strobe signal DV_DQS shown in FIG. 2.

The second delay circuit 120 of the write clock generation circuit 12 delays the divided strobe signal DV_DQS and generates the write clock WCLK. For convenience of explanation, it is assumed that there is no delay introduced by the second delay circuit 120 for the described case. Without the delay, the write clock WCLK and the divided strobe signal DV_DQS appear the same.

The second latch signal generation circuit 150 of the control signal generation circuit 20 latches the detection signal DET of the logic low level at the rising edge time of the write clock WCLK (as indicated by the rightmost descending arrow of FIG. 6) and generates the second latch signal LT<2> (shown in FIG. 4) of the logic low level.

The second buffer circuit 160 of the control signal generation circuit 20 buffers the second latch signal LT<2>, in response to the pulse of the write clock WCLK of the logic high level, and generates the control signal WL_CON of the logic low level. In the case where the pulse of the write clock WCLK is not inputted, the second buffer circuit 160 does not drive the node nd21, regardless of the logic level of the second latch signal LT<2>, and holds the logic level of the control signal WL_CON.

The phase difference adjustment circuit 2 quickly adjusts the phase of the write clock WCLK in response to the control signal WL_CON of the logic low level, and generates the internal strobe signal IDQS which toggles from a time T8. The phase difference adjustment circuit 2 performs a write leveling operation of quickly adjusting the phase of the write clock WCLK by the control signal WL_CON of the logic low level. It is shown that the rising edge of the internal strobe signal IDQS and the rising edge of the clock CLK are synchronized at the time T8 by the write leveling operation.

The internal circuit 3 (shown in FIG. 1) inputs and/or outputs data DATA in synchronization with the internal strobe signal IDQS.

As is apparent from the above descriptions for the semiconductor device 100, by detecting the phase difference of the clock CLK and the strobe signal DQS having different frequencies, by holding a detection result generated during the toggling period of the strobe signal DQS after the toggling period, and by adjusting the phase difference of the clock CLK and the strobe signal DQS depending on the detection result, that it is possible to secure the reliability of a write leveling operation.

The semiconductor device 100 described above with reference to FIGS. 1 through 6 may be applied to an electronic system which includes a memory system, a graphics system, a computing system, or a mobile system. For example, referring to FIG. 7, an electronic system 1000 is shown in accordance with an embodiment of the present teachings. The electronic system 1000 may include a data storage 1001 device, a memory controller 1002, a buffer memory 1003, and an input/output interface 1004.

Figure 7:
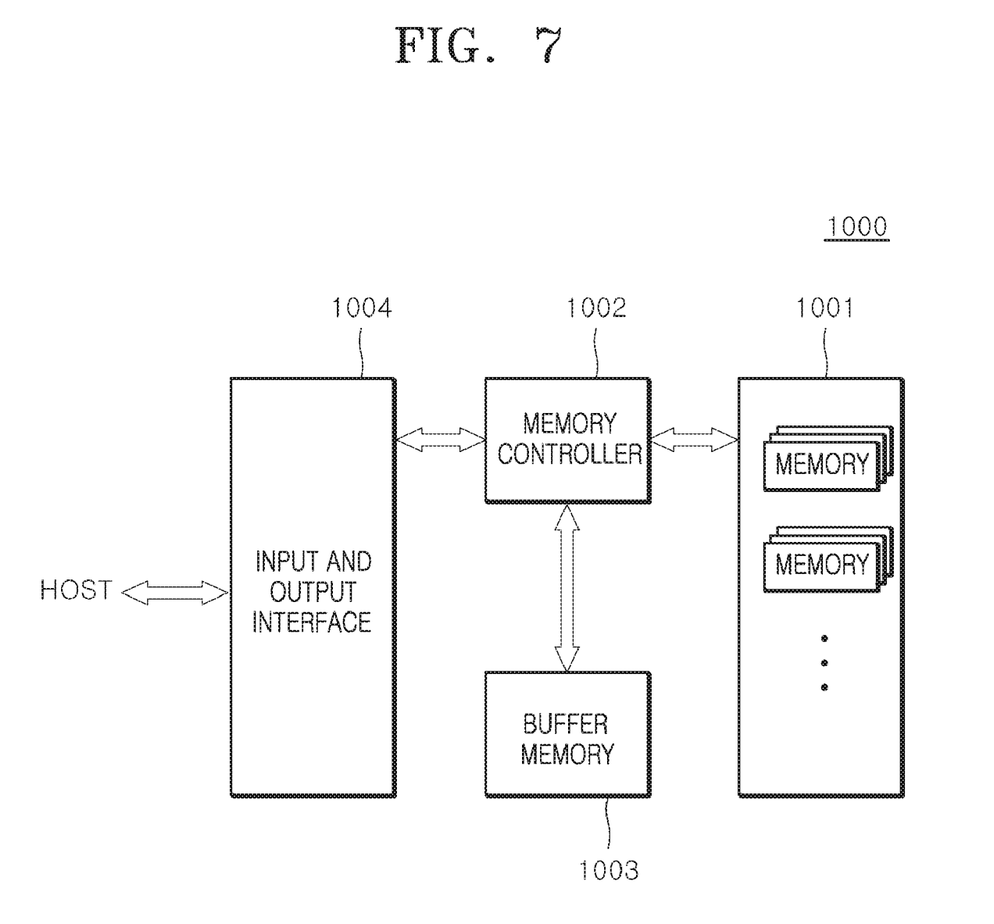
FIG. 7 shows a diagram illustrating a configuration of an electronic system to which the semiconductor device shown in FIGS. 1 through 6 is applied.

The data storage device 1001 stores data applied from the memory controller 1002, reads out stored data, and outputs the read-out data to the memory controller 1002, according to control signals from the memory controller 1002. The data storage device 1001 may include the semiconductor device 100 shown in FIG. 1. The data storage device 1001 may include nonvolatile memory capable of not losing and continuously storing data even when a power supply is interrupted. The nonvolatile memory may be realized as a flash memory, such as NOR flash memory and/or NAND flash memory, a phase change random access memory (PRAM), a resistive random access memory (RRAM), a spin transfer torque random access memory (STTRAM), or a magnetic random access memory (MRAM).

The memory controller 1002 decodes commands applied through the input/output interface 1004 from an external device (a host) and controls the input/output of data with respect to the data storage device 1001 and the buffer memory 1003, according to decoding results. While the memory controller 1002 is illustrated as a single block in FIG. 7, it is to be noted that, in the memory controller 1002, a controller for controlling nonvolatile memory and a controller for controlling the buffer memory 1003 as volatile memory may be independently configured.

The buffer memory 1003 may temporarily store data to be processed in the memory controller 1002, that is, data to be inputted and outputted to and from the data storage device 1001. The buffer memory 1003 may store data applied from the memory controller 1002 according to a control signal. The buffer memory 1003 reads out stored data and outputs the read-out data to the memory controller 1002. The buffer memory 1003 may include volatile memory, such as dynamic random access memory (DRAM), mobile DRAM, and static random access memory (SRAM).

The input/output interface 1004 provides a physical coupling between the memory controller 1002 and the external device (the host) such that the memory controller 1002 may receive control signals for the input/output of data from the external device and may exchange data with the external device. The input/output interface 1004, for example, may include one among various interface protocols, such as USB, MMC, PCI-E, SAS, SATA, PATA, SCSI, ESDI and IDE.

The electronic system 1000 may be used as an auxiliary memory device or as an external storage device of the host. The electronic system 1000 may include a solid state disk (SSD), a universal serial bus (USB) memory, a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the described embodiments represent only some of a greater number of possible embodiments. Accordingly, the semiconductor device described herein should not be limited to the described embodiments.

What is claimed is:

1. A semiconductor device comprising:
a phase difference detection circuit comprising:
a clock signal input and a strobe signal input,
a first delay circuit operatively coupled to the clock signal input;
a frequency divider circuit operatively coupled to the strobe signal input;
a second delay circuit operatively coupled to the frequency divider circuit; and
a detection signal generation circuit operatively coupled to both the first delay circuit and the second delay circuit;
wherein:
a clock signal received at the clock signal input is delayed by the first delay circuit by a first predetermined amount of time to thereby generate a delayed clock signal;
a strobe signal input to the frequency divider circuit has a frequency, and is divided to thereby provide a divided strobe signal having a lower frequency than the frequency of the received strobe signal and which is provided to the second delay circuit;
the second delay circuit delays the divided strobe signal by a second predetermined amount of time to thereby provide a write clock signal from the frequency-divided strobe signal,
the detection signal generation circuit receives the delayed clock signal circuit from the first delay circuit and receives the write clock signal from the second delay circuit and generates therefrom a detection signal by, detecting a phase difference between the clock signal and the strobe signal, the detection signal being generated in synchronization with the clock; and
a control signal generation circuit, which receives the write clock signal and the detection signal and which is configured to: store the detection signal, in synchronization with the write clock, and output the stored detection signal as a control signal, which is provided to a phase adjustment circuit;
wherein the strobe signal is a signal which toggles only during a preset period, and
wherein a frequency of the strobe signal is set to 2N times the frequency of the clock, wherein N is a positive integer.

2. The semiconductor device according to claim 1, wherein the clock and the strobe signal are signals which have different frequencies.

3. The semiconductor device according to claim 1, wherein the second delay circuit provides substantially the same delay as the first delay circuit.

4. The semiconductor device according to claim 1, wherein the control signal generation circuit comprises:

a second latch signal generation circuit configured to output the detection signal as a second latch signal in synchronization with the write clock; and a second buffer circuit configured to buffer the second latch signal, in response to a pulse of the write clock, and configured to generate the control signal.

5. The semiconductor device according to claim 1, wherein the detection signal is generated at the logic level of the strobe signal at a rising edge time of the clock.

6. The semiconductor device according to claim 1, wherein detection signal is stored in synchronization with a rising edge of the write clock.

7. A semiconductor device comprising:
a write leveling control circuit, the write leveling control circuit comprising:
   a clock signal input and a strobe signal input,
   a first delay circuit operatively coupled to the clock signal input;
   a frequency divider circuit operatively coupled to the strobe signal input;
   a second delay circuit operatively coupled to the frequency divider circuit; and
   a detection signal generation circuit operatively coupled to both the first delay circuit and the second delay circuit;
   wherein:
      a clock signal received at the clock signal input is delayed by the first delay circuit by a first predetermined amount of time to thereby generate a delayed clock signal;
      a strobe signal input to the frequency divider circuit has a frequency, and is divided to thereby provide a divided strobe signal having a lower frequency than the frequency of the received strobe signal and which is provided to the second delay circuit;
      the second delay circuit delays the divided strobe signal by a second predetermined amount of time to thereby provide a write clock signal from the frequency-divided strobe signal,
      the detection signal generation circuit receives the delayed clock signal circuit from the first delay circuit and receives the write clock signal from the second delay circuit and generates therefrom a detection signal by detecting a phase difference between the delayed clock signal and the write clock signal, the detection signal being generated in synchronization with the clock; and
   a control signal generation circuit, which receives the write clock signal and the detection signal and which is configured to: store the detection signal, in synchronization with the write clock, and output the stored detection signal as a control signal, which is provided to a phase adjustment circuit;
   wherein a frequency of the strobe signal is set to 2N times the frequency of the clock, wherein N is a positive integer.

8. The semiconductor device according to claim 7, wherein the detection signal is enabled when a phase of the strobe signal is earlier than a phase of the clock.

9. The semiconductor device according to claim 7, wherein the clock and the strobe signal are signals which have different frequencies.

10. The semiconductor device according to claim 7, wherein a frequency of the divided strobe signal is set to 1/2N times the frequency of the strobe signal, wherein N represents a positive integer.

11. The semiconductor device according to claim 7, wherein the second delay circuit is set to have the same delay amount as the first delay circuit.

12. The semiconductor device according to claim 7, wherein the detection signal generation circuit comprises:
   a first latch signal generation circuit configured to output the write clock as a first latch signal in synchronization with the delayed clock; and
   a first buffer circuit configured to buffer the first latch signal and generate the detection signal.

13. The semiconductor device according to claim 7, wherein the control signal generation circuit comprises:
   a second latch signal generation circuit configured to output the detection signal as a second latch signal in synchronization with the write clock; and
   a second buffer circuit configured to buffer the second latch signal, in response to a pulse of the write clock, and generate the control signal.

14. The semiconductor device according to claim 7, wherein the detection signal is generated at the logic level of the strobe signal at a rising edge time of the clock.

* * * * *

UNITED STATES PATENT AND TRADEMARK OFFICE
CERTIFICATE OF CORRECTION

Page 1 of 1

PATENT NO. : 10,885,958 B2
APPLICATION NO. : 16/192479
DATED : January 5, 2021
INVENTOR(S) : Yu Ri Lim and Sangsic Yoon It is certified that error appears in the above-identified patent and that said Letters Patent is hereby corrected as shown below:

On the Title Page

Item (73) Assignee:
Replace "SK hynix Inc., Gyeonggi (KR)" with --SK hynix Inc., Icheon-si Gyeonggi-do (KR)--

Item (74) Attorney, Agent, or Firm:
Add --William Park & Associates Ltd.--

Signed and Sealed this
Twenty-third Day of November, 2021

Drew Hirshfeld
*Performing the Functions and Duties of the*
*Under Secretary of Commerce for Intellectual Property and*
*Director of the United States Patent and Trademark Office*